(12) United States Patent
Yoshida

(10) Patent No.: US 9,656,370 B2
(45) Date of Patent: May 23, 2017

(54) GRINDING METHOD

(71) Applicant: DISCO CORPORATION, Tokyo (JP)

(72) Inventor: Shinji Yoshida, Tokyo (JP)

(73) Assignee: Disco Corporation, Tokyo (JP)

( * ) Notice: Subject to any disclaimer, the term of this patent is extended or adjusted under 35 U.S.C. 154(b) by 48 days.

(21) Appl. No.: 14/875,875

(22) Filed: Oct. 6, 2015

(65) Prior Publication Data

US 2017/0095902 A1    Apr. 6, 2017

(51) Int. Cl.
| | |
|---|---|
| *B24B 37/20* | (2012.01) |
| *B24B 49/12* | (2006.01) |
| *B24B 7/22* | (2006.01) |
| *B24B 49/04* | (2006.01) |
| *H01L 21/687* | (2006.01) |
| *H01L 21/304* | (2006.01) |
| *H01L 21/66* | (2006.01) |

(52) U.S. Cl.
CPC .............. *B24B 49/04* (2013.01); *B24B 7/228* (2013.01); *B24B 49/12* (2013.01); *H01L 21/304* (2013.01); *H01L 21/68785* (2013.01); *H01L 22/20* (2013.01)

(58) Field of Classification Search
CPC ......... B24B 37/26; B24B 37/22; B24B 37/20; B24B 37/205

USPC .......................... 451/526, 527, 533, 534, 529
See application file for complete search history.

(56) References Cited

FOREIGN PATENT DOCUMENTS

| | | |
|---|---|---|
| JP | 2007-335458 | 12/2007 |
| JP | 2008-073785 | 4/2008 |
| JP | 2008-264913 | 11/2008 |
| JP | 2013-119123 | 6/2013 |

*Primary Examiner* — Robert Rose
(74) *Attorney, Agent, or Firm* — Greer Burns & Crain Ltd.

(57) ABSTRACT

A grinding method includes a pre-grinding step of grinding a plate-shaped workpiece to a thickness just before a finish thickness is reached using a finish grinding unit, a thickness measuring step of measuring a thickness of the workpiece after the pre-grinding step, a calculation step of calculating, from the measured thickness of the workpiece, a variation amount of the distance between a holding face of the chuck table and a grinding face of a finish grindstone before and after inclination adjustment of the chuck table, and a height adjustment step of adjusting, on the basis of the variation amount, the inclination of the chuck table while adjusting the height of the finish grinding unit so that the relative moving speed between the finish grindstone and the workpiece in a state in which the grinding face contacts with an upper face of the workpiece becomes equal to zero.

2 Claims, 5 Drawing Sheets

GRINDING METHOD

BACKGROUND OF THE INVENTION

Field of the Invention

The present invention relates to a grinding method for grinding a plate-shaped workpiece to a desired thickness while the thickness of the plate-shaped workpiece is measured.

Description of the Related Art

In a grinding process, a method is known wherein a plate-shaped workpiece is ground while the thickness thereof is measured by a height gauge of the contact type (for example, refer to Japanese Patent Laid-Open No. 2008-073785). In a height gauge of the contact type, a pair of contactors are contacted with an upper face of a plate-shaped workpiece and an upper face of a chuck table to detect the thickness of the plate-shaped workpiece from the difference in height between the contacting positions of the contactors. Further, as a grinding method of a bonded work configured from a plurality of plate-shaped workpieces, a method is known wherein the bonded work is ground while the thickness of the upper side work of a grinding target is measured by thickness measuring means of the contactless type (for example, refer to Japanese Patent Laid-Open No. 2008-264913). The thickness measuring means of the contactless type detects the thickness of a plate-shaped workpiece from the optical path difference of a laser beam reflected by upper and lower faces of the upper side work.

Also a method is known wherein a height gauge of the contact type and thickness measuring means of the contactless type are combined to measure the thickness of a plate-shaped workpiece while the plate-shaped workpiece is ground (for example, refer to Japanese Patent Laid-Open No. 2007-335458). According to this grinding method, upon rough grinding, the rough grinding amount is adjusted while the total thickness of a plate-shaped workpiece including the thickness of a protective tape is measured by the height gauge of the contact type. Then, upon finish grinding, the finish amount is controlled while only the thickness of the plate-shaped workpiece is measured by the thickness measuring means of the contactless type. Further, in addition to the grinding methods described above, also a method is known wherein the inclination of a chuck table with respect to grinding means is adjusted on the basis of the measured thickness of a plate-shaped workpiece to grind the plate-shaped workpiece with a uniform thickness (for example, refer to Japanese Patent Laid-Open No. 2013-119123).

SUMMARY OF THE INVENTION

In the grinding method disclosed in Japanese Patent Laid-Open No. 2013-119123, the thickness of a plate-shaped workpiece at a predetermined location is measured in a state in which the grinding means is retracted (lifted) from the chuck table in order to carry out adjustment of the inclination of the chuck table. Then, the inclination of the chuck table is adjusted on the basis of a result of the measurement. Therefore, the grinding method has a problem in that the moving distance of the grinding means to the grinding starting position increases and much time is required for the grinding process.

On the other hand, when the thickness of a plate-shaped workpiece is not measured, the upper face height of the chuck table is measured in a state in which the grindstone is retracted from the chuck table, and then the inclination of the chuck table is adjusted. Then, the upper face height of the chuck table is measured again, and the grinding feed amount is calculated on the basis of the difference between the upper face heights before and after the inclination adjustment. Since the measurement is carried out separately twice before and after the inclination adjustment in this manner, much time is required for calculation of the grinding feed amount. Therefore, in addition to the increase of the moving distance of the grinding means, further time is required for the grinding process.

Therefore, it is an object of the present invention to provide a grinding method which can reduce the grinding time period.

In accordance with an aspect of the present invention, there is provided a grinding method in which a grinding apparatus is used which includes a chuck table configured to hold a plate-shaped workpiece thereon, grinding means for causing a grinding face of a grindstone to abut with an upper face of the plate-shaped workpiece held by the chuck table to reduce a thickness of the plate-shaped workpiece, grinding feeding means for moving the grinding means toward and away from the chuck table to perform grinding feeding in a grinding feeding direction, measurement means for measuring a thickness of the plate-shaped workpiece ground by the grinding means, diametrically moving means for moving the measurement means in a diametrical direction of the chuck table, and inclination adjustment means for adjusting an inclination relationship between the chuck table and the grinding means, the grinding method including a pre-grinding step of grinding the plate-shaped workpiece to a thickness, which does not reach a finish thickness set in advance, using the grinding means, a thickness measuring step of moving the measuring means in a diametrical direction along the plate-shaped workpiece ground at the pre-grinding step by the diametrically moving means to measure a thickness of the plate-shaped workpiece along the diametrical direction, a calculation step of calculating, when the inclination relationship between the chuck table and the grinding means is adjusted by the inclination adjustment means so that the finish thickness is uniformized along the diametrical direction on a basis of a measurement result measured at the thickness measuring step, a variation amount of a distance between an upper face of the chuck table and the grinding face of the grindstone, a height adjustment step of causing the grinding feeding means and the inclination adjustment means to operate on a basis of the variation amount calculated at the calculation step and maintaining, during the inclination adjustment operation by the inclination adjustment means, a state in which the grinding face contacts with a grinding object face of the plate-shaped workpiece at the pre-grinding step, and a finish grinding step of causing, after the height adjustment step, the grinding feeding means to feed the grinding means for grinding while the thickness of the plate-shaped workpiece is measured by the measurement means to a finish thickness set in advance to grind the plate-shaped workpiece.

With the configuration described above, by the pre-grinding step, the grinding face of the grindstone located at the predetermined height with respect to the chuck table is transcribed to the plate-shaped workpiece. Therefore, by measuring the thickness of the plate-shaped workpiece, the distance between the upper face of the chuck table and the grinding face of the grindstone is determined indirectly. Further, from a thickness measurement result of the plate-shaped workpiece, the variation amount of the distance between the upper face of the chuck table and the grinding face of the grindstone when the inclination of the chuck table is adjusted is calculated. Then, on the basis of the variation amount, the grinding means and the inclination adjustment means are operated so that the contacting state between the grinding object face of the plate-shaped workpiece and the grinding face may be maintained. Therefore, the height of the grinding means is adjusted following up the inclination adjustment operation of the chuck table. Consequently, the moving distance of the grinding means upon inclination adjustment can be minimized and the grinding time can be reduced.

In accordance with another aspect of the present invention, there is provided a grinding method in which a grinding apparatus is used which includes a chuck table configured to hold a plate-shaped workpiece thereon, grinding means for causing a grinding face of a grindstone to abut with an upper face of the plate-shaped workpiece held by the chuck table to reduce a thickness of the plate-shaped workpiece, grinding feeding means for moving the grinding means toward and away from the chuck table to perform grinding feeding in a grinding feeding direction, measurement means for measuring a thickness of the plate-shaped workpiece ground by the grinding means, diametrically moving means for moving the measurement means in a diametrical direction of the chuck table, and inclination adjustment means for adjusting an inclination relationship between the chuck table and the grinding means, the grinding method including a pre-grinding step of grinding the plate-shaped workpiece to a thickness, which does not reach a finish thickness set in advance, using the grinding means, a thickness measuring step of moving the measuring means in a diametrical direction along the plate-shaped workpiece ground at the pre-grinding step by the diametrically moving means to measure a thickness of the plate-shaped workpiece along the diametrical direction, a calculation step of calculating, when the inclination relationship between the chuck table and the grinding means is adjusted by the inclination adjustment means so that the finish thickness is uniformized along the diametrical direction on a basis of a measurement result measured at the thickness measuring step, a variation amount of a distance between an upper face of the chuck table and the grinding face of the grindstone, a height adjustment step of causing the grinding feeding means and the inclination adjustment means to operate on a basis of the variation amount calculated at the calculation step and maintaining a grinding feeding speed of the grinding means by the grinding feeding means, and a finish grinding step of causing, after the height adjustment step, the grinding feeding means to feed the grinding means for grinding while the thickness of the plate-shaped workpiece is measured by the measurement means to a finish thickness set in advance to grind the plate-shaped workpiece.

With the configuration described above, by the pre-grinding step, the grinding face of the grindstone located at the predetermined height with respect to the chuck table is transcribed to the plate-shaped workpiece. Therefore, by measuring the thickness of the plate-shaped workpiece, the distance between the upper face of the chuck table and the grinding face of the grindstone is determined indirectly. Further, from a thickness measurement result of the plate-shaped workpiece, the variation amount of the distance between the upper face of the chuck table and the grinding face of the grindstone when the inclination of the chuck table is adjusted is calculated. Then, on the basis of the variation amount, the grinding means and the inclination adjustment means are operated so that the relative moving speed between the grindstone and the plate-shaped workpiece becomes equal to the grinding feeding speed. In other words, the inclination of the chuck table is adjusted while the plate-shaped workpiece is ground. Therefore, the inclination adjustment time can be utilized effectively and the grinding time can be reduced.

The above and other objects, features and advantages of the present invention and the manner of realizing them will become more apparent, and the invention itself will best be understood, from a study of the following description and appended claims with reference to the attached drawings showing a preferred embodiment of the invention.

DETAILED DESCRIPTION OF THE PREFERRED EMBODIMENT

Figure 1:
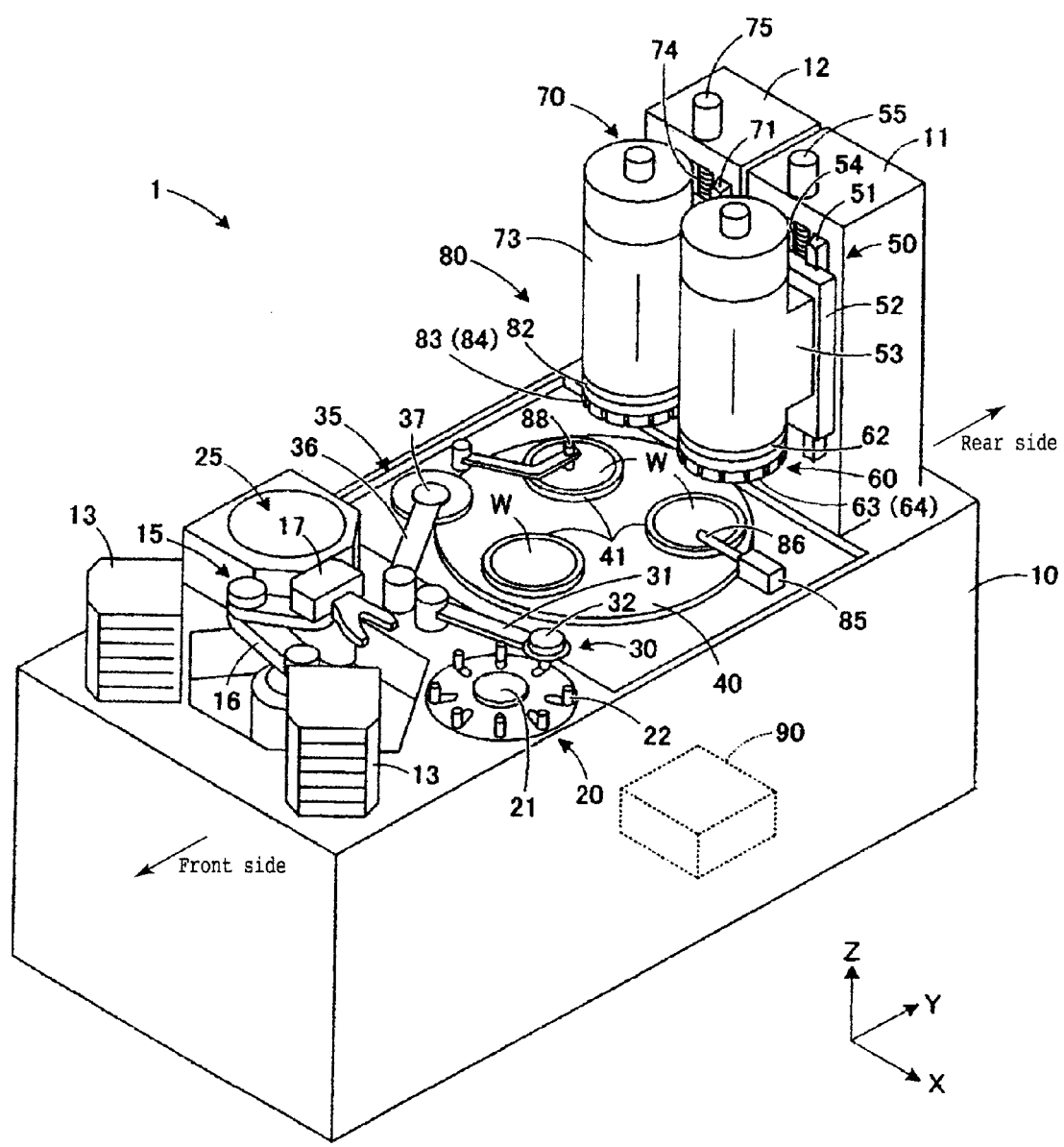
FIG. 1 is a perspective view of a grinding apparatus according to an embodiment.

In the following, a grinding apparatus is described with reference to the accompanying drawings. FIG. 1 is a perspective view of a grinding apparatus according to an embodiment. It is to be noted that, in the present embodiment, the configuration of the grinding apparatus is not restricted to that depicted in FIG. 1. The grinding apparatus may be configured in any manner only if it can carry out a grinding work for a plate-shaped workpiece.

As depicted in FIG. 1, a grinding apparatus 1 is a processing apparatus of the full automatic type and is configured so as to fully automatically carry out a series of processes for a plate-shaped workpiece W including a carrying-in process, a rough grinding process, a finish grinding process, a washing process and a carrying-out process. The plate-shaped workpiece W is formed in a substantially disk shape and is configured from a semiconductor substrate, for example, of silicon, gallium arsenide or the like, an inorganic material substrate of ceramic, glass, sapphire or the like, or a package substrate of a semiconductor product.

On the front side of a base 10 of the grinding apparatus 1, a pair of cassettes 13 in each of which a plurality of plate-shaped workpieces W are accommodated are placed. On the rear of the pair of cassettes 13, a cassette robot 15 is provided which loads and unloads a plate-shaped workpiece W into and from the cassettes 13. On both oblique rear sides of the cassette robot 15, a positioning mechanism 20 for positioning a plate-shaped workpiece W before grinding and a washing mechanism 25 for washing a plate-shaped workpiece W after grinding are provided. Between the positioning mechanism 20 and the washing mechanism 25, carrying-in means 30 for carrying in a plate-shaped workpiece W before grinding to a chuck table 41 and carrying-out means 35 for carrying out a plate-shaped workpiece W after grinding from the chuck table 41.

The cassette robot 15 is configured from a hand unit 17 provided at a tip end of a robot arm 16 configured from a multi-node link. By the cassette robot 15, a plate-shaped workpiece W before grinding is transported from a cassette 13 to the positioning mechanism 20, and a plate-shaped workpiece W after grinding is transported from the washing mechanism 25 to a cassette 13. The positioning mechanism 20 is configured from a plurality of positioning pins 22 disposed around a temporary placement table 21 for movement toward and away from the center of the temporary placement table 21. In the positioning mechanism 20, the plurality of positioning pins 22 are abutted with an outer circumferential edge of a plate-shaped workpiece W placed on the temporary placement table 21 to position the center of the plate-shaped workpiece W at the center of the temporary placement table 21.

The carrying-in means 30 is configured from a carrying-in pad 32 provided at a tip end of a carrying-in arm 31 which can be pivoted on the base 10. In the carrying-in means 30, a plate-shaped workpiece W is lifted from the temporary placement table 21 by the carrying-in pad 32 and the carrying-in pad 32 is turned by the carrying-in arm 31 to carry the plate-shaped workpiece W onto the chuck table 41. The carrying-out means 35 is configured from a carrying-out pad 37 provided at a tip end of a carrying-out arm 36 which can be pivoted on the base 10. In the carrying-out means 35, a plate-shaped workpiece W is lifted from the chuck table 41 by the carrying-out pad 37 and the carrying-out pad 37 is turned by the carrying-out arm 36 to carry out the plate-shaped workpiece W from the chuck table 41.

The washing mechanism 25 is configured from various nozzles (not depicted) which inject washing water and dry air toward a spinner table (not depicted). By the washing mechanism 25, the spinner table which holds a plate-shaped workpiece W thereon is moved down to the base 10, and washing water is injected to the base 10 to spinner-wash the plate-shaped workpiece W, whereafter dry air is injected to dry the plate-shaped workpiece W. Behind the carrying-in means 30 and the carrying-out means 35, a turntable 40 is provided and has three chuck tables 41 disposed thereon in an equidistantly spaced relationship from each other in a circumferential direction.

On an upper face of the chuck table 41, a holding face 42 (refer to FIG. 2) is formed from a porous plastic material. The holding face 42 is formed in a conical shape which has an apex at the center of rotation of the chuck table 41 and an outer peripheral face a little lower than the center (refer to FIG. 2). If a plate-shaped workpiece W is sucked to and held on the holding face 42, then also the plate-shaped workpiece W comes to have a conical shape gently sloping along the holding face 42. The inclination of the chuck table 41 with respect to rough grinding means 60 and finish grinding means 80 is adjusted by inclination adjustment means 43 (refer to FIG. 2). The inclination adjustment means 43 is hereinafter described.

When the turntable 40 rotates intermittently over a distance of 120 degrees, the plate-shaped workpiece W is positioned successively to carrying-in and carrying-out positions at which the plate-shaped workpiece W is carried in and out, respectively, a rough grinding position at which the plate-shaped workpiece W confronts with the rough grinding means 60, and a finish grinding position at which the plate-shaped workpiece W confronts with the finish grinding means 80. At the rough grinding position, the plate-shaped workpiece W on the chuck table 41 is roughly ground to a predetermined thickness by the rough grinding means 60. At the finish grinding position, the plate-shaped workpiece W on the chuck table 41 is finish ground to a finish thickness by the finish grinding means 80. In the proximity of the rough grinding position and the finish grinding position, a column 11 on which the rough grinding means 60 is supported and another column 12 on which the finish grinding means 80 is supported are provided uprightly.

On the front face of the column 11, grinding feeding means 50 is provided which moves the rough grinding means 60 toward and away from the chuck table 41 and feeds the rough grinding means 60 for grinding in a grinding feeding direction. The grinding feeding means 50 is configured such that a pair of guide rails 51 (only one is depicted) are disposed in parallel to the Z axis direction on the front face of the column 11 and a motor-driven Z-axis table 52 is mounted for sliding movement on the pair of guide rails 51. The rough grinding means 60 is supported on the front face of the Z-axis table 52 through a housing 53. A ball screw 54 is screwed on the rear face side of the Z-axis table 52, and a driving motor 55 is connected to one end of the ball screw 54. When the ball screw 54 is driven to rotate by the driving motor 55, the rough grinding means 60 is moved in the Z axis direction by the guide rails 51.

Grinding feeding means 70 is provided on the front face of the column 12 and moves the finish grinding means 80 toward and away from the chuck table 41 to feed the finish grinding means 80 for grinding in a grinding feeding direction. The grinding feeding means 70 is configured such that a pair of guide rails 71 (only one is depicted) are disposed on the front face of the column 12 in parallel to the Z axis direction and a motor-driven Z-axis table (not depicted) is disposed for sliding movement on the pair of guide rails 71. A ball screw 74 is screwed on the rear face side of the Z-axis table, and a driving motor 75 is connected to one end of the ball screw 74. When the ball screw 74 is driven to rotate by the driving motor 75, the finish grinding means 80 is moved in the Z-axis direction along the guide rails 71.

The rough grinding means 60 and the finish grinding means 80 are configured by including mounts 62 and 82 at a lower end of cylindrical spindles. On a lower face of the mount 62 of the rough grinding means 60, a grinding wheel 64 for rough grinding is mounted. The grinding wheel 64 has a plurality of rough grindstones 63 disposed annularly thereon. Each rough grindstone 63 is configured from a diamond grindstone including diamond abrasive grain solidified by a binding agent such as, for example, metal bond or resin bond. Meanwhile, a grinding wheel 84 is mounted on a lower face of the mount 82 of the finish grinding means 80 and has a plurality of finish grindstones 83 disposed annularly thereon. Each finish grindstone 83 is formed from grindstone grain of a particle size smaller than that of the rough grindstone 63.

Further, at the rough grinding position, upper face height measurement means 85 of the contact type for measuring the upper face height of the plate-shaped workpiece W is provided adjacent the rough grinding means 60. The upper face height measurement means 85 is a height gauge of the contact type, and detects the upper face height of the plate-shaped workpiece W from the height of the contact position with a contactor 86 thereof contacted with the upper face of the plate-shaped workpiece W. Further, at the finish grinding position, thickness measurement means 88 of the contactless type for measuring the thickness of the plate-shaped workpiece W is provided adjacent the finish grinding means 80. The thickness measurement means 88 irradiates a laser beam upon the plate-shaped workpiece W to measure the thickness of the plate-shaped workpiece W from the optical path difference of the laser light reflected by upper and lower faces of the plate-shaped workpiece W.

Further, in the base 10, control means 90 for comprehensively controlling the components of the grinding apparatus 1 is provided. The control means 90 implements various controls such as rough grinding control by the rough grinding means 60, finish grinding control by the finish grinding means 80, thickness measurement control of the plate-shaped workpiece W and inclination adjustment control of the chuck table 41 by the inclination adjustment means 43. It is to be noted that the control means 90 is configured from a processor which executes various processes, a memory and so forth. The memory is configured from one or a plurality of storage media such as a read only memory (ROM) and a random access memory (RAM) according to usage. Into the memory, a rough grinding amount, a thickness measurement result of a plate-shaped workpiece W, a target finish thickness of the plate-shaped workpiece W, an inclination adjustment amount of the chuck table 41 and so forth are temporarily stored.

In such a grinding apparatus 1 as described above, a plate-shaped workpiece W is transported to the positioning mechanism 20 from within a cassette 13 and is centered by the positioning mechanism 20. Then, the plate-shaped workpiece W is carried in to the chuck table 41 and is successively positioned at the rough grinding position and the finish grinding position by rotation of the turntable 40. At the rough grinding position, rough grinding is carried out while the upper face height of the plate-shaped workpiece W is measured by the upper face height measurement means 85. Consequently, the plate-shaped workpiece W is ground by the rough grinding means 60 until a predetermined rough grinding amount is reached. At the finish grinding position, after the plate-shaped workpiece W is pre-ground to a thickness which does not reach the finish thickness, the thickness of the plate-shaped workpiece W is measured at a plurality of locations. Then, while the finish grinding means 80 and the inclination adjustment means 43 are operated on the basis of a measurement result of the thickness, the inclination of the chuck table 41 is finely adjusted. After the inclination adjustment, the plate-shaped workpiece W is ground to the finish thickness and is formed so as to have a uniform thickness.

Figure 2:
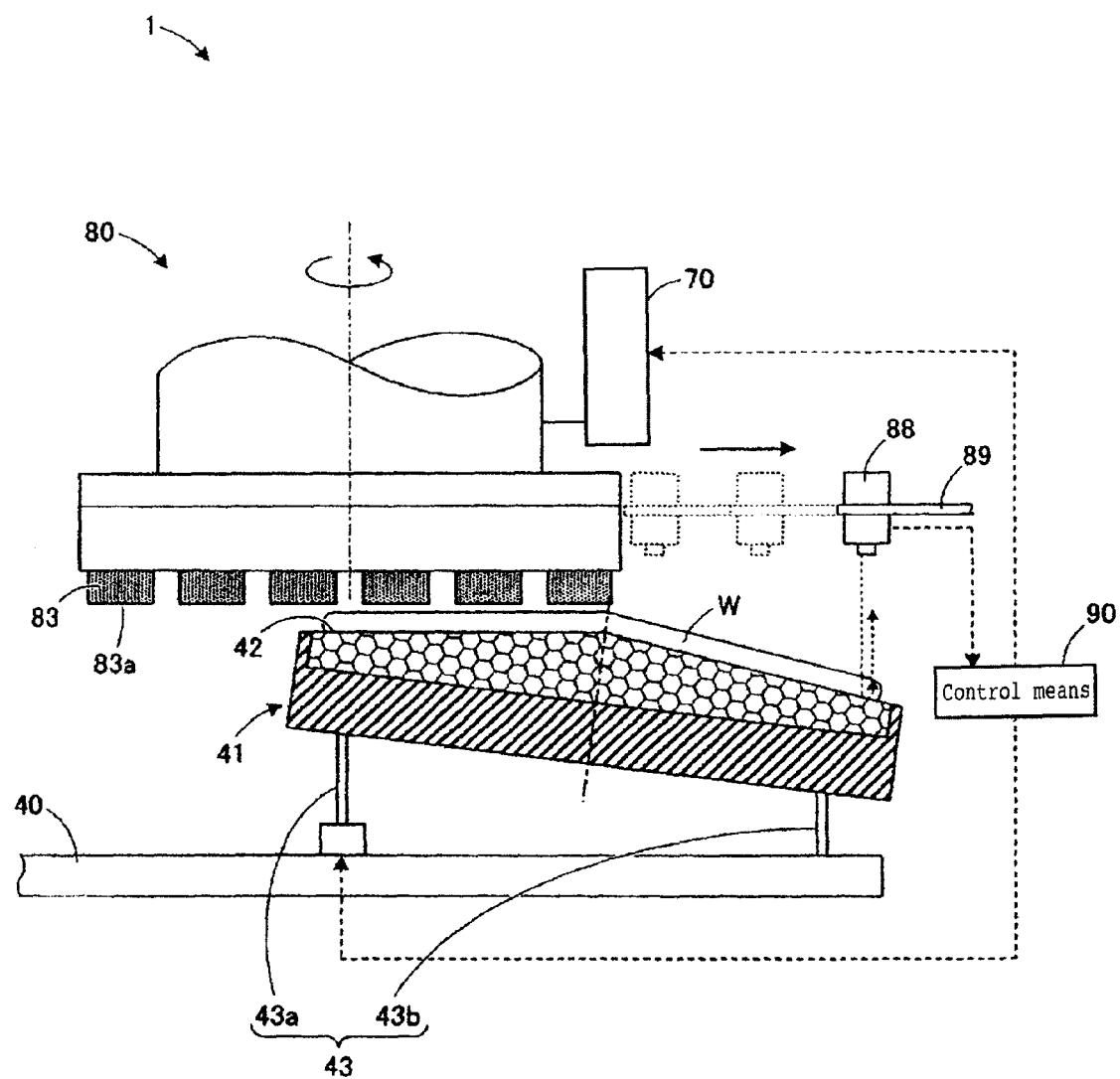
FIG. 2 is a schematic view of the grinding apparatus according to the present embodiment around a finish grinding position.

In the following, the configuration of the grinding means and the chuck table according to the present embodiment is described with reference to FIG. 2. FIG. 2 is a schematic view of the grinding apparatus according to the present embodiment around the finish grinding position. It is to be noted that FIG. 2 illustrates a state in which a plate-shaped workpiece after rough grinding therefor ends is positioned at the finish grinding position.

As depicted in FIG. 2, the chuck table 41 is provided for rotation on the turntable 40 through inclination adjustment means 43. The inclination adjustment means 43 is configured from two movable posts 43*a* (only one is depicted) and one fixed post 43*b* and support at three portions in the proximity of an outer periphery of the chuck table 41. The movable posts 43*a* are configured, for example, from electrically driven actuators. By the inclination adjustment means 43, the chuck table 41 is inclined around a fulcrum at the fixed post 43*b* by upward and downward movements of the two movable posts 43*a*. For example, upon finish grinding process, the two movable posts 43*a* are operated so that a grinding face 83*a* of the grindstones 83 and the holding face 42 of the chuck table 41 may be placed into a parallel state to adjust the inclination of the chuck table 41. The finish grinding means 80 is provided above the turntable 40. The chuck table 41 is positioned such that the grindstones 83 pass the center of the plate-shaped workpiece W. The finish grinding means 80 reduces the thickness of the plate-shaped workpiece W with the grinding face 83*a* of the grindstones 83 thereof abutted with the upper face of the plate-shaped workpiece W held by the chuck table 41.

The thickness measurement means 88 for measuring the thickness of the plate-shaped workpiece W is provided sidewardly of the finish grinding means 80. The thickness measurement means 88 is provided at a tip end of a pivot arm 89 mounted for pivotal motion around a fulcrum at a predetermined location of an outer periphery of the turntable 40. The pivot arm 89 configures diametrical moving means in the claims, and the thickness measurement means 88 is moved in a diametrical direction on the plate-shaped workpiece W by the pivoting motion of the pivot arm 89. Further, the thickness measurement means 88 irradiates laser light toward the plate-shaped workpiece W and calculates the thickness of the plate-shaped workpiece W on the basis of an optical path difference reflected by the upper and lower faces of the plate-shaped workpiece W. The thickness measurement is carried out at three arbitrary locations including a location in the proximity of the center of the chuck table 41, another location in the proximity of an outer periphery of the chuck table 41, and a further location between the center and the outer periphery of the chuck table 41. It is to be noted that, while, in the description of the present embodiment, the configuration wherein the thickness of the plate-shaped workpiece W is measured at three locations is described, the configuration for the measurement is not limited to this. The number of measurement locations may be any number if it is two or more.

The thickness measurement means 88, grinding feeding means 70, and inclination adjustment means 43 are connected to the control means 90. The thickness of the plate-shaped workpiece W measured by the thickness measurement means 88 is outputted to the control means 90. Further, the control means 90 calculates, from thickness measurement results measured at the three locations, the variation amount of the distance between the holding face 42 of the chuck table 41 and the grinding face 83*a* of the grindstones 83 when the inclination relationship between the chuck table 41 and the finish grinding means 80 is adjusted. In particular, the inclination degree of the chuck table 41 is recognized from the three measurement locations in a diametrical direction.

The control means 90 controls the driving amount of the movable posts 43*a* of the inclination adjustment means 43 and the feed amount of the grinding feeding means 70 upon inclination adjustment on the basis of the variation amount. After the inclination adjustment, the control means 90 controls the grinding feed amount of the grinding feeding means 70 until a finish thickness of the plate-shaped workpiece W set in advance is reached while the thickness of the plate-shaped workpiece W is supervised by the thickness measurement means 88. It is to be noted that the finish thickness of the plate-shaped workpiece W set in advance is stored in the memory of the control means 90.

Now, a grinding method carried out in a first operation pattern is described. FIGS. 3A to 3D are explanatory views of the first operation pattern of the grinding method according to the present embodiment, and FIGS. 4A to 4D are explanatory views of a second operation pattern according to the present embodiment.

As depicted in FIGS. 3A to 3D, in the grinding method according to the present embodiment, a pre-grinding step, a thickness measurement step, a calculation step, a height adjustment step, and a finish grinding step are carried out in order at the finish grinding position. It is to be noted that the grinding feeding speed of the finish grinding means 80 at the finish grinding position is comparatively low with respect to the grinding feeding speed of the rough grinding means 60 (refer to FIG. 1) at the rough grinding position. Therefore, in the grinding method according to the present embodiment, it is made possible to reduce the time required for the overall grinding step by reducing the operation time at the finish grinding position as far as possible.

Before a plate-shaped workpiece W is positioned at the finish grinding position, a rough grinding step is carried out at the rough grinding position first (refer to FIG. 1). At the rough grinding step, rough grinding is carried out while the upper face height of the plate-shaped workpiece W is measured, and the plate-shaped workpiece W is ground until a target rough grinding amount is reached. It is to be noted that, at the rough grinding step, the inclination of the chuck table 41 is adjusted so that the grinding face of the rough grinding means 60 and the holding face 42 of the chuck table 41 are placed into a parallel state. However, the parallelism between the grinding face of the rough grinding means 60 and the holding face 42 of the chuck table 41 includes some error. Therefore, the plate-shaped workpiece W immediately after the rough grinding has a non-uniform thickness distribution. In the description of the first operation pattern, the plate-shaped workpiece W which is formed thin at a central portion thereof and thick at an outer peripheral portion thereof by the rough grinding step is described.

When the rough grinding step ends, the plate-shaped workpiece W is positioned from the rough grinding position to the finish grinding position by intermittent rotation of the turntable 40. At this time, the chuck table 41 is positioned at the finish grinding position while it maintains the inclination upon rough grinding. However, the rough grinding means 60 and the finish grinding means 80 are sometimes subtly different from each other in contact angle of the grinding face with the plate-shaped workpiece W by mounting errors or the like. Therefore, in the grinding method according to the present embodiment, a pre-grinding step by the finish grinding means 80 is carried out at the finish grinding position first.

Figure 3A:
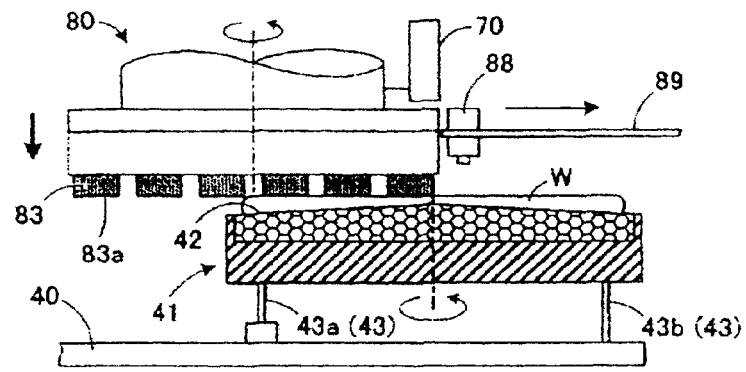
FIGS. 3A to 3D are explanatory views of a first operation pattern of a grinding method according to the present embodiment.

As depicted in FIG. 3A, at the pre-grinding step, the plate-shaped workpiece W is ground to a thickness, which does not reach the finish thickness set in advance, by the finish grinding means 80. In particular, the finish grinding means 80 is moved down while it is rotated, and the grinding face 83a of the grindstones 83 and the upper face of the plate-shaped workpiece W are rotationally contacted with each other to pre-grind the plate-shaped workpiece W. Then, when the predetermined grinding amount is reached, the feeding operation of the grinding moving means is stopped. At this time, the grinding face 83a contacts with the upper face of the plate-shaped workpiece W. It is to be noted that, at this time, the rotational operation of the finish grinding means 80 may be stopped.

At the pre-grinding step, since the upper face of the plate-shaped workpiece W is ground a little, the upper face of the plate-shaped workpiece W is adjusted. Therefore, at the next thickness measurement step, measurement light irradiated from the thickness measurement means 88 can be prevented from being reflected at random by the upper face of the plate-shaped workpiece W. As a result, the influence upon thickness measurement of the plate-shaped workpiece W can be suppressed to the minimum. Further, a surface shape of the grinding face 83a of the grindstones 83 is transcribed to the plate-shaped workpiece W, and the grinding face 83a and the upper face of the plate-shaped workpiece W coincide with each other. Consequently, the thickness of the plate-shaped workpiece W can be regarded as a distance between the grinding face 83a of the grindstones 83 and the holding face 42 of the chuck table 41.

Figure 3B:
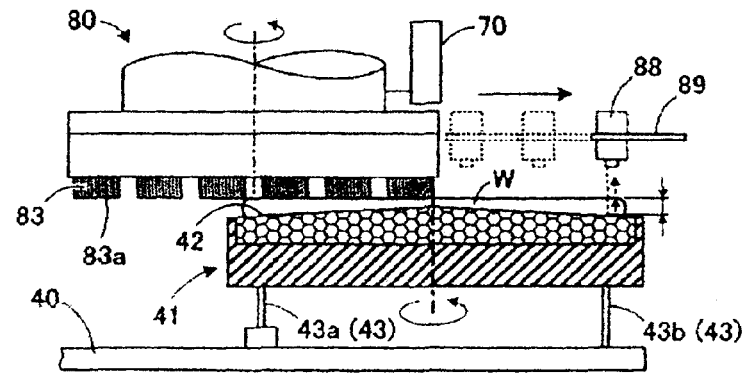

Then, the thickness measurement step is carried out. As depicted in FIG. 3B, at the thickness measurement step, after the grinding feeding of the finish grinding means 80 is stopped once, the thickness measurement means 88 is moved in a diametrical direction with respect to the plate-shaped workpiece W ground at the pre-grinding step. Through the movement, the thickness of the plate-shaped workpiece W is measured. In particular, the pivot arm 89 (diametrically moving means) is pivoted to move the thickness measurement means 88 toward the outer periphery from the center of the plate-shaped workpiece W. At this time, the thickness measurement means 88 measures the thickness of the plate-shaped workpiece W at three arbitrary positions of the plate-shaped workpiece W in the diametrical direction.

Thereafter, the calculation step is carried out. At the calculation step, the variation amount of the distance between the holding face 42 and the grinding face 83a before and after the inclination adjustment is calculated on the basis of measurement results measured at the thickness measurement step. Since the distance between the holding face 42 and the grinding face 83a differs at the three measured locations, it is possible to recognize the inclination degree of the chuck table 41 from the measurement results. Then, from the inclination degree, the variation amount of the distance between the holding face 42 and the grinding face 83a necessary for placing the holding face 42 and the grinding face 83a into a parallel state to each other can be calculated. In particular, from the thickness measurement results of the plate-shaped workpiece W, the variation amount of the distance between the holding face 42 and the grinding face 83a necessary to finish the plate-shaped workpiece W to a uniform thickness can be calculated.

Figure 3C:
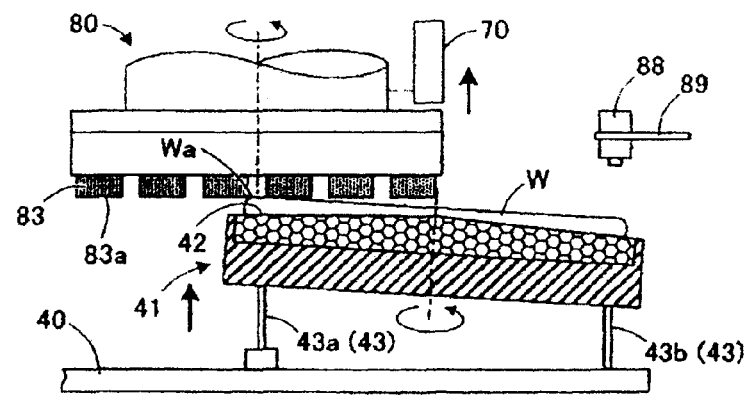

Then, the height adjustment step is carried out. As depicted in FIG. 3C, at the height adjustment step, the grinding feeding means 70 and the inclination adjustment means 43 are operated on the basis of the variation amount of the distance between the holding face 42 and the grinding face 83a calculated at the calculation step. At this time, the rotation of the finish grinding means 80 and the chuck table 41 may be stopped. In the state depicted in FIG. 3C, since the thickness of the plate-shaped workpiece W is greater at the center than at an outer periphery, the movable posts 43a of the inclination adjustment means 43 are moved upwardly so as to increase the grinding amount at an outer peripheral portion. As the movable posts 43a move upwardly, the finish grinding means 80 is moved upwardly by an amount equal to that by which the holding face 42 of the chuck table 41 is moved upwardly. Further, the distance by which an outer periphery Wa of the upper face of the plate-shaped workpiece W is moved upwardly by the upward movement amount by which the movable posts 43a moves upwardly is the distance by which the finish grinding means 80 moves upwardly.

At this time, the finish grinding means 80 is moved upwardly at a speed equal to the upwardly moving speed of the movable posts 43a following the operation of the movable posts 43a. For example, the speed at which the outer periphery Wa of the upper face of the plate-shaped workpiece W is moved upwardly at an upward movement speed at which the inclination adjustment means 43 moves upwardly becomes a speed at which the finish grinding means 80 moves upwardly. In particular, the moving speed (feeding speed) of the finish grinding means 80 and the moving speed of the movable posts 43a of the inclination adjustment means 43 are controlled so that the relative moving speed between the finish grindstones 83 and the plate-shaped workpiece W may be equal to zero. Consequently, during the inclination adjustment operation, the state in which the grinding face 83a contacts with a portion of the upper face (face to be ground) of the plate-shaped workpiece W in the proximity of the outer periphery is maintained. Consequently, the moving amount of the finish grinding means 80 upon inclination adjustment can be minimized and the time required for inclination adjustment can be reduced. As a result of the driving of the inclination adjustment means 43, the inclination of the chuck table 41 is adjusted so that the grinding face 83a and the holding face 42 may be placed into a parallel state and the finish thickness of the plate-shaped workpiece W may be uniformized.

Figure 3D:
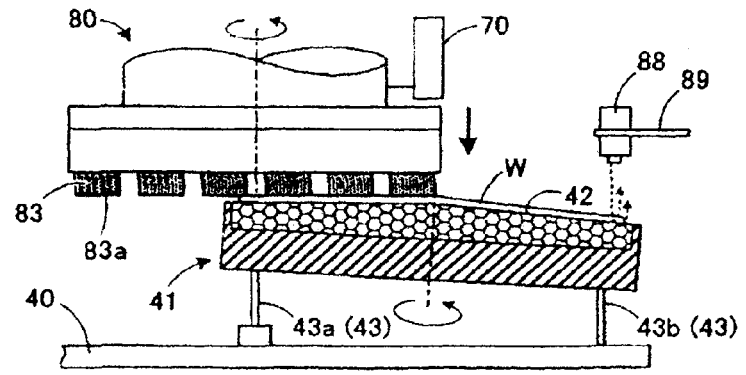

Then, the finish grinding step is carried out. At the finish grinding step, the plate-shaped workpiece W is ground until a finish thickness set in advance is reached as depicted in FIG. 3D. Upon finish grinding, while the finish grinding means 80 and the chuck table 41 are rotated, the finish grinding means 80 is fed for grinding by the grinding feeding means 70. The finish grinding is carried out while the thickness of the plate-shaped workpiece W is measured by the thickness measurement means 88 positioned above an outer peripheral edge of the plate-shaped workpiece W. Then, when the measurement value reaches the set finish thickness, the feeding for grinding is stopped and the finish grinding is ended. As a result, the plate-shaped workpiece W is ground to a uniform thickness.

Now, the second operation pattern is described with reference to FIGS. 4A to 4D. In the second operation pattern, the shape of a plate-shaped workpiece after rough grinding is different from that in the first operation pattern. It is to be noted that, in the description of the second operation pattern, a plate-shaped workpiece is described which is formed by the rough grinding step such that it is thick at a central portion thereof but is thin at an outer peripheral portion thereof.

Figure 4A:
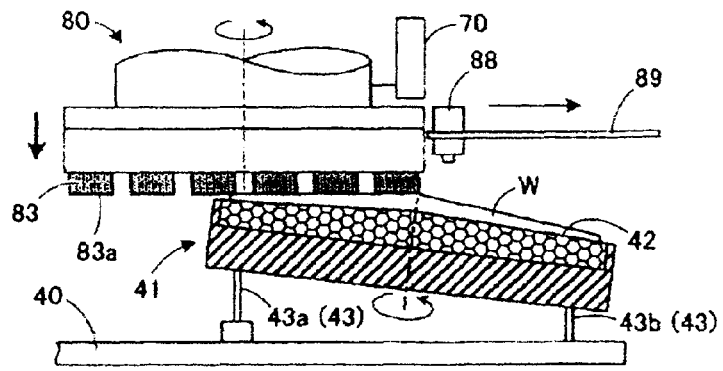
FIGS. 4A to 4D are explanatory views of a second operation pattern of a grinding method according to the present embodiment.
Figure 4B:
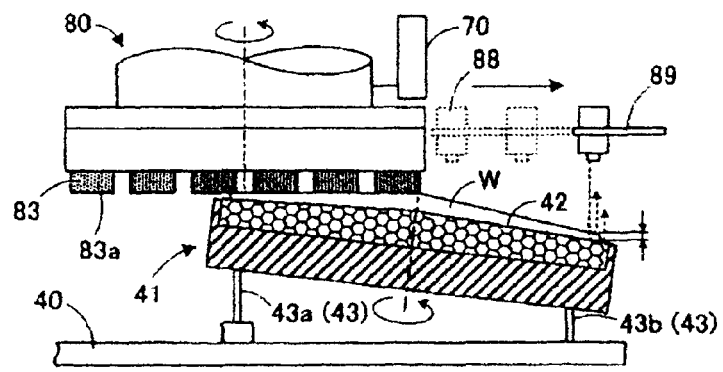

As depicted in FIG. 4A, at the finish grinding position, a pre-grinding step is carried out at the finish grinding position first, and the plate-shaped workpiece W is ground to a thickness which does not reach a finish thickness set in advance. Then, the thickness measurement step is carried out, at which the thickness of the plate-shaped workpiece W is measured at three locations of the plate-shaped workpiece W as depicted in FIG. 4B. Then, the calculation step is carried out, at which the variation amount of the distance between the holding face 42 of the chuck table 41 and the grinding face 83a of the grindstones 83 before and after the inclination adjustment is calculated.

Figure 4C:
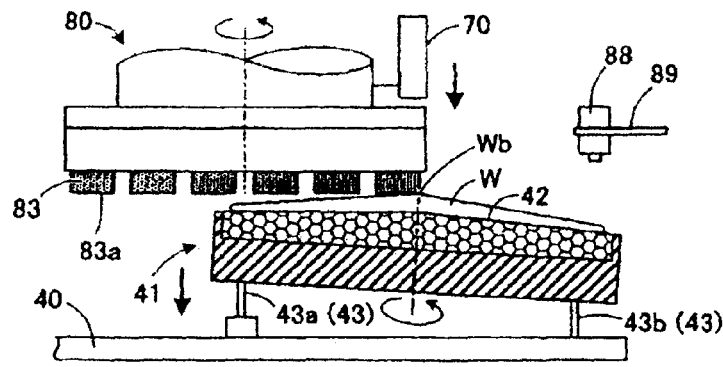

Then, the height adjustment step is carried out. As depicted in FIG. 4C, at the height adjustment step, the grinding feeding means 70 and the inclination adjustment means 43 are operated on the basis of the variation amount of the distance between the holding face 42 and the grinding face 83a calculated at the preceding calculation step. In the state depicted in FIG. 4C, since the plate-shaped workpiece W is thinner at an outer periphery thereof than the center thereof as described hereinabove, the movable posts 43a of the inclination adjustment means 43 are moved downwardly so that the grinding amount at the central portion may be increased. As the movable posts 43a moves downwardly, the finish grinding means 80 moves down by an amount equal to the amount by which the holding face 42 of the chuck table 41 moves down. For example, the distance over which a center Wb of the upper face of the plate-shaped workpiece W moves down by a downwardly moving amount by which the movable posts 43a moves down becomes the distance by which the finish grinding means 80 moves down.

At this time, the finish grinding means 80 is moved down (fed for grinding) at a speed equal to the downwardly moving speed of the movable posts 43a following up the operation of the movable posts 43a. For example, the speed at which the center Wb of the upper face of the plate-shaped workpiece W moves down by a moving down speed at which the movable posts 43a move down becomes a speed at which the finish grinding means 80 moves down. In particular, the moving speed (feeding speed) of the finish grinding means 80 and the moving speed of the movable posts 43a of the inclination adjustment means 43 are controlled so that the relative moving speed between the finish grindstones 83 and the plate-shaped workpiece W becomes equal to zero. Consequently, during inclination adjustment operation, the state in which the grinding face 83a contacts with a portion of the upper face (face to be ground) of the plate-shaped workpiece W in the proximity of the center is maintained. Consequently, the moving amount of the finish grinding means 80 upon inclination adjustment can be minimized, and the time required for inclination adjustment can be reduced. As a result of the driving of the inclination adjustment means 43, the inclination of the chuck table 41 is adjusted so that the grinding face 83a and the holding face 42 may be placed into a parallel state and the finish thickness of the plate-shaped workpiece W may be uniform.

Figure 4D:
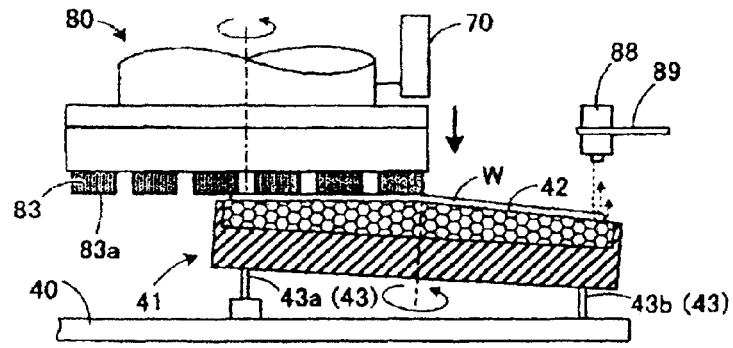

Then, the finish grinding step is carried out. As depicted in FIG. 4D, at the finish grinding step, the plate-shaped workpiece W is ground until a finish thickness set in advance is reached. As a result, the plate-shaped workpiece W is ground to a uniform thickness. In this manner, also in the second operation pattern, the time required for the entire grinding step can be reduced by reducing the operation time at the finish grinding position as far as possible.

As described above, according to the first and second operation patterns of the grinding method according to the present embodiment, the grinding face 83a of the finish grindstones 83 which is positioned at a predetermined height with respect to the chuck table 41 is transcribed to the plate-shaped workpiece W by the pre-grinding step. Therefore, by measuring the thickness of the plate-shaped workpiece W, the distance between the holding face 42 and the grinding face 83a is determined. Further, from a result of the thickness measurement of the plate-shaped workpiece W, the variation amount of the distance between the holding face 42 and the grinding face 83a when the inclination of the chuck table 41 is adjusted is calculated. Then, on the basis of the variation amount, the finish grinding means 80 and the inclination adjustment means 43 are operated so that the contact state between the upper face (face to be ground) of the plate-shaped workpiece W and the grinding face 83a may be maintained. Therefore, the height of the finish grinding means 80 is adjusted following up the inclination adjustment operation of the chuck table 41. Consequently, the moving distance of the finish grinding means 80 upon inclination adjustment can be minimized, and the grinding time can be reduced.

Now, a third operation pattern of the grinding method according to the present embodiment is described with reference to FIGS. 5A to 5D. The third operation pattern is different from the first operation pattern in that inclination adjustment is carried out while grinding is carried out. In the following, description is given principally of the difference. It is to be noted that, in the description of the third operation pattern, a plate-shaped workpiece is described which is formed by the rough grinding step such that it is thin at a central portion thereof but is thick at an outer peripheral portion thereof. The configuration is not limited to this. As depicted in FIGS. 4A to 4D, it is applicable to the plate-shaped workpiece which is formed thin at a central portion thereof and thick at an outer peripheral portion thereof.

Figure 5A:
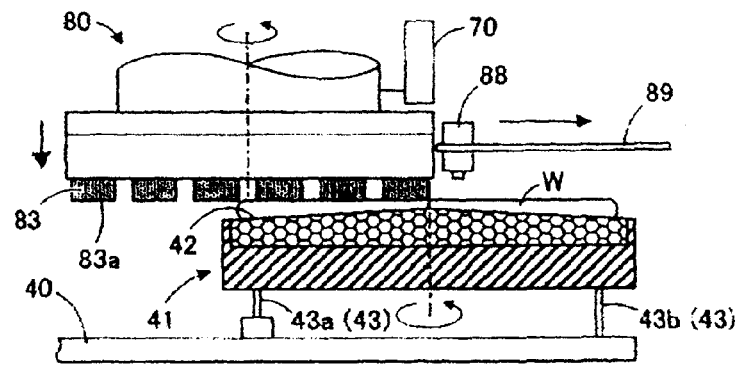
FIGS. 5A to 5D are explanatory views of a third operation pattern of a grinding method according to the present embodiment.
Figure 5B:
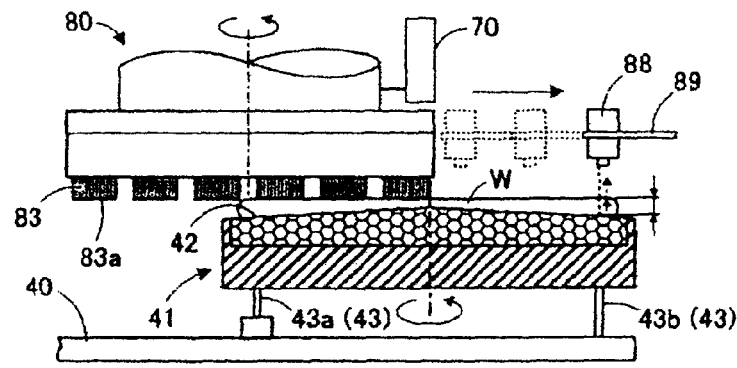

As depicted in FIG. 5A, at the finish grinding position, a pre-grinding step is carried out first, at which the plate-shaped workpiece W is ground to a thickness which does not reach a finish thickness set in advance. Then, as depicted in FIG. 5B, the thickness measurement step is carried out, at which the thickness is measured at three locations of the plate-shaped workpiece W. Then, the calculation step is carried out as depicted in FIG. 5B, at which the variation amount of the distance between the holding face 42 of the chuck table 41 and the grinding face 83*a* of the finish grindstones 83 before and after the inclination adjustment is carried out on the basis of a measurement result measured at the thickness measurement step.

Figure 5C:
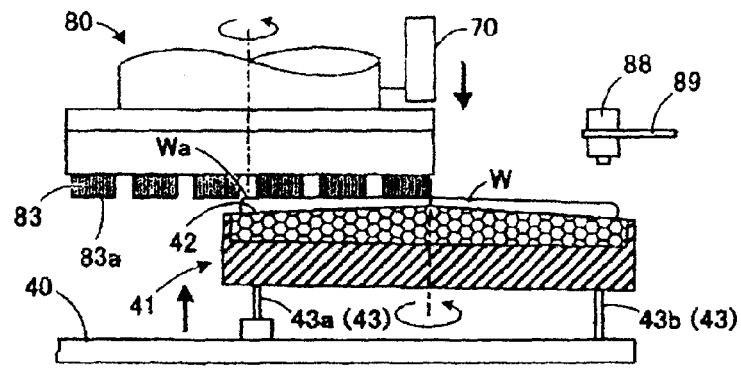

Then, the height adjustment step is carried out. As depicted in FIG. 5C, at the height adjustment step, the grinding feeding means 70 and the inclination adjustment means 43 are operated on the basis of the variation amount of the distance between the holding face 42 and the grinding face 83*a* calculated at the calculation step. At this time, the finish grinding means 80 and the chuck table 41 are in a rotating state. In the state depicted in FIG. 5C, since the thickness of the plate-shaped workpiece W is greater at an outer periphery than at the center of the plate-shaped workpiece W as described hereinabove, the movable posts 43*a* of the inclination adjustment means 43 are moved upwardly so as to increase the grinding amount at an outer peripheral portion of the plate-shaped workpiece W. On the other hand, the finish grinding means 80 is moved downwardly (fed for grinding) maintaining a fixed feeding speed by the grinding feeding means 70 while it presses the grinding face 83*a* against the plate-shaped workpiece W. Consequently, while the plate-shaped workpiece W is ground, the inclination adjustment of the chuck table 41 can be carried out.

At this time, the feeding speed of the finish grinding means 80 is adjusted so that the downwardly moving speed of the finish grinding means 80 with respect to the movable posts 43*a* becomes a speed suitable for finish grinding. In particular, the moving speed (feeding speed) of the finish grinding means 80 and the moving speed of the movable posts 43*a* of the inclination adjustment means 43 are controlled so that the relative moving speed between the finish grindstones 83 and the plate-shaped workpiece W may become equal to the grinding feeding speed. For example, the grinding feeding of the finish grinding means 80 is stopped, and the outer periphery Wa of the upper face of the plate-shaped workpiece W is fed for grinding at a speed equal to the grinding feeding speed toward the finish grindstones 83 by the upwardly moving speed of the movable posts 43*a* of the inclination adjustment means 43. Further, the grinding feeding of the finish grinding means 80 may not be stopped. In this case, by setting the upwardly moving speed at which the movable posts 43*a* moves upwardly higher than the feeding speed of the finish grinding means 80, the relative moving speed between the finish grindstones 83 and the plate-shaped workpiece W can be made equal to the grinding feeding speed.

In this manner, since grinding is carried out also during inclination adjustment, the time for inclination adjustment can be effectively utilized. Further, there is no necessity to move the finish grinding means 80 upwardly for inclination adjustment, and the moving amount can be minimized. Therefore, the time required for the inclination adjustment can be reduced. As a result of the driving of the inclination adjustment means 43, the inclination of the chuck table 41 can be adjusted so that the grinding face 83*a* and the holding face 42 are placed into a parallel state and the finish thickness of the plate-shaped workpiece W is uniformized.

Figure 5D:
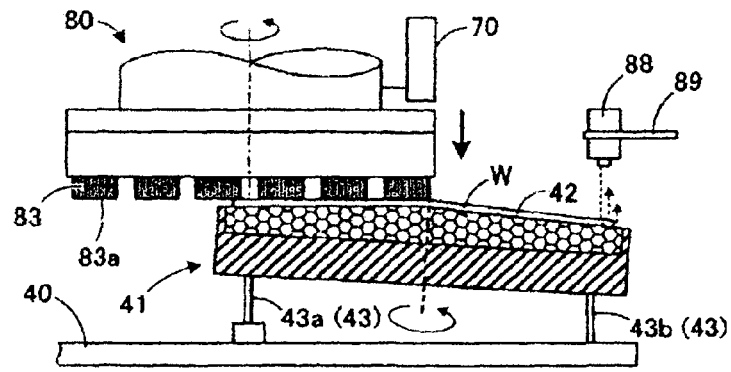

After the inclination adjustment, the grinding feeding is continued as it is, and then the finish grinding step is entered. As depicted in FIG. 5D, at the finish grinding step, the plate-shaped workpiece W is ground until the finish thickness set in advance is reached. As a result, the plate-shaped workpiece W is ground to a uniform thickness. In this manner, in the third operation pattern, since the inclination adjustment of the chuck table 41 is carried out while the plate-shaped workpiece W is ground at the height adjustment step, not only the inclination adjustment time can be reduced, but also the finish grinding time at the finish grinding step can be reduced. Therefore, since the operation time of the grinding apparatus 1 (refer to FIG. 1) at the finish grinding position is reduced as far as possible, the time required for the entire grinding step can be reduced.

It is to be noted that the present invention is not limited to the embodiment described hereinabove but can be carried out in various modified manners. The size, shape and so forth depicted in the accompanying drawings are not limited to those of the embodiment described above and can be altered suitably within the scope of the present invention within which the effects of the present invention can be achieved. Further, the present invention can be carried out suitably modifying the embodiment described without departing from the scope of the object of the present invention.

For example, while the thickness measurement means 88 in the embodiment described above is configured such that it irradiates a laser beam upon a plate-shaped workpiece W to measure the thickness of the plate-shaped workpiece W, the configuration of the thickness measurement means 88 is not limited to this. The thickness measurement means 88 may be configured in any manner only if it is configured so as to measure the thickness of a plate-shaped workpiece W.

Further, while the turntable 40 in the embodiment described hereinabove is configured such that the three chuck tables 41 are disposed thereon, the configuration of the turntable 40 is not limited to this. Only it is necessary for the turntable 40 to be configured such that a plurality of chuck tables 41 are disposed in an equidistantly spaced relationship in a peripheral direction. For example, two chuck tables 41 may be disposed on the turntable 40, or four or more chuck tables 41 may be disposed on the turntable 40.

Further, while the inclination adjustment means 43 in the embodiment described hereinabove is configured from two movable posts 43*a* and one fixed post 43*b*, the configuration of the inclination adjustment means 43 is not limited to this. The inclination adjustment means 43 may be configured from three or more movable posts 43*a* with respect to one fixed post 43*b*. Alternatively, the inclination adjustment means 43 may be configured only from three or more movable posts 43*a*.

Further, while the grinding apparatus 1 in the embodiment described hereinabove is configured such that it carries out the first, the second, and the third operation patterns, the configuration of the grinding apparatus 1 is not limited to this. The grinding apparatus 1 may be configured such that an operation pattern thereof includes the pre-grinding step, the thickness measurement step, the calculation step, the height adjustment step, and the finish grinding step described hereinabove.

Further, while the height adjustment step of the third operation pattern in the embodiment described hereinabove is configured such that inclination adjustment of the chuck table 41 is carried out while the finish grinding means 80 is being fed for grinding, the height adjustment step is not limited to this. At the height adjustment step, inclination adjustment of the chuck table 41 may be carried out after the grinding feeding by the grinding feeding means 70 is stopped while the finish grinding means 80 remains rotated. In this case, it is necessary to set the moving speed of the movable posts 43*a* to a grinding feeding speed suitable for finish grinding.

Further, while the grinding feeding means 70 and the inclination adjustment means 43 in the embodiment described above are operated on the basis of the variation amount of the distance between the holding face 42 and the grinding face 83*a*, the configuration of the grinding feeding means 70 and the inclination adjustment means 43 is not limited to this. The grinding feeding means 70 and the inclination adjustment means 43 may be operated on the basis of the variation amount of the angle defined by the holding face 42 and the grinding face 83*a*.

As described above, the present invention exhibits an effect that the time for grinding can be reduced and is particularly effective for a grinding method for grinding a plate-shaped workpiece to a desired thickness while the thickness of the plate-shaped workpiece is measured.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A grinding method in which a grinding apparatus is used which includes a chuck table configured to hold a plate-shaped workpiece thereon, grinding means for causing a grinding face of a grindstone to abut with an upper face of the plate-shaped workpiece held by the chuck table to reduce a thickness of the plate-shaped workpiece, grinding feeding means for moving the grinding means toward and away from the chuck table to perform grinding feeding in a grinding feeding direction, measurement means for measuring a thickness of the plate-shaped workpiece ground by the grinding means, diametrically moving means for moving the measurement means in a diametrical direction of the chuck table, and inclination adjustment means for adjusting an inclination relationship between the chuck table and the grinding means, the grinding method comprising:
 a pre-grinding step of grinding the plate-shaped workpiece to a thickness, which does not reach a finish thickness set in advance, using the grinding means;
 a thickness measuring step of moving the measuring means in a diametrical direction along the plate-shaped workpiece ground at the pre-grinding step by the diametrically moving means to measure a thickness of the plate-shaped workpiece along the diametrical direction;
 a calculation step of calculating, when the inclination relationship between the chuck table and the grinding means is adjusted by the inclination adjustment means so that the finish thickness is uniformized along the diametrical direction on a basis of a measurement result measured at the thickness measuring step, a variation amount of a distance between an upper face of the chuck table and the grinding face of the grindstone;
 a height adjustment step of causing the grinding feeding means and the inclination adjustment means to operate on a basis of the variation amount calculated at the calculation step and maintaining, during the inclination adjustment operation by the inclination adjustment means, a state in which the grinding face contacts with a ground face of the plate-shaped workpiece at the pre-grinding step; and
 a finish grinding step of causing, after the height adjustment step, the grinding feeding means to feed the grinding means for grinding while the thickness of the plate-shaped workpiece is measured by the measurement means to a finish thickness set in advance to grind the plate-shaped workpiece.

2. A grinding method in which a grinding apparatus is used which includes a chuck table configured to hold a plate-shaped workpiece thereon, grinding means for causing a grinding face of a grindstone to abut with an upper face of the plate-shaped workpiece held by the chuck table to reduce a thickness of the plate-shaped workpiece, grinding feeding means for moving the grinding means toward and away from the chuck table to perform grinding feeding in a grinding feeding direction, measurement means for measuring a thickness of the plate-shaped workpiece ground by the grinding means, diametrically moving means for moving the measurement means in a diametrical direction of the chuck table, and inclination adjustment means for adjusting an inclination relationship between the chuck table and the grinding means, the grinding method comprising:
 a pre-grinding step of grinding the plate-shaped workpiece to a thickness, which does not reach a finish thickness set in advance, using the grinding means;
 a thickness measuring step of moving the measuring means in a diametrical direction along the plate-shaped workpiece ground at the pre-grinding step by the diametrically moving means to measure a thickness of the plate-shaped workpiece along the diametrical direction;
 a calculation step of calculating, when the inclination relationship between the chuck table and the grinding means is adjusted by the inclination adjustment means so that the finish thickness is uniformized along the diametrical direction on a basis of a measurement result measured at the thickness measuring step, a variation amount of a distance between an upper face of the chuck table and the grinding face of the grindstone;
 a height adjustment step of causing the grinding feeding means and the inclination adjustment means to operate on a basis of the variation amount calculated at the calculation step and maintaining a grinding feeding speed of the grinding means by the grinding feeding means; and
 a finish grinding step of causing, after the height adjustment step, the grinding feeding means to feed the grinding means for grinding while the thickness of the plate-shaped workpiece is measured by the measurement means to a finish thickness set in advance to grind the plate-shaped workpiece.

* * * * *